(12) United States Patent
Sherman et al.

(10) Patent No.: US 6,608,535 B2
(45) Date of Patent: Aug. 19, 2003

(54) SUSPENDED TRANSMISSION LINE WITH EMBEDDED SIGNAL CHANNELING DEVICE

(75) Inventors: James R. Sherman, Seminole, FL (US); Elvin C. Chou, St. Petersburg, FL (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/205,828

(22) Filed: Jul. 26, 2002

(65) Prior Publication Data

US 2002/0180557 A1 Dec. 5, 2002

Related U.S. Application Data

(63) Continuation of application No. 09/548,686, filed on Apr. 13, 2000.

(51) Int. Cl.$^7$ ................................................. H01P 5/12
(52) U.S. Cl. ..................... 333/128; 333/136; 333/238
(58) Field of Search ............................... 333/128, 238, 333/116, 246, 161, 204, 136

(56) References Cited

U.S. PATENT DOCUMENTS

| | | | |
|---|---|---|---|
| 3,320,556 A | 5/1967 | Schneider | 333/34 |
| 3,419,813 A | 12/1968 | Kamnitsis | 330/30 |
| 4,214,217 A | 7/1980 | Saito et al. | 334/45 |
| 4,254,386 A | 3/1981 | Nemit et al. | 333/128 |
| 4,310,814 A | 1/1982 | Bowman | 333/121 |
| 4,394,633 A | 7/1983 | Klein | 333/238 |
| 4,614,922 A | 9/1986 | Bauman et al. | 333/161 |
| 4,647,880 A | 3/1987 | Argaman | 333/164 |
| 4,772,864 A | 9/1988 | Otto et al. | 333/238 |
| 4,916,457 A | 4/1990 | Foy et al. | 343/770 |
| 4,945,319 A | 7/1990 | Wilson | 333/33 |
| 4,958,165 A | 9/1990 | Axford et al. | 343/770 |
| 4,987,377 A | 1/1991 | Gray et al. | 330/54 |
| 5,021,755 A | 6/1991 | Gustafson | 333/128 |
| 5,030,935 A | 7/1991 | Williams et al. | 333/246 |
| 5,187,490 A | 2/1993 | Ohta et al. | 343/770 |
| 5,200,719 A | 4/1993 | Margulis et al. | 333/34 |
| 5,293,175 A | 3/1994 | Hemmie et al. | 343/795 |
| 5,444,453 A | 8/1995 | Lalezari | 343/700 MS |
| 5,471,181 A | 11/1995 | Park | 333/246 |
| 5,581,266 A | 12/1996 | Peng et al. | 343/770 |

(List continued on next page.)

FOREIGN PATENT DOCUMENTS

| | | | |
|---|---|---|---|
| EP | 0 317 414 A1 | 5/1989 | H01Q/21/24 |
| EP | 0 508 662 A2 | 10/1992 | H01P/5/12 |
| EP | 0 801 433 A1 | 10/1997 | H01P/3/08 |
| JP | 63281502 | 11/1988 | H01P/5/08 |
| JP | S63-281502 | 11/1988 | H01P/6/08 |
| WO | WO 01/80348 | 10/2001 | H01P/3/08 |
| WO | WO 01/80350 A1 | 10/2001 | H01P/5/16 |

OTHER PUBLICATIONS

Pozar, D.M., *Microwave Engineering*, John Wiley & Sons, Inc., Second Edition, pp. 363–368., 1998.

(List continued on next page.)

*Primary Examiner*—Robert Pascal
*Assistant Examiner*—Dean Takaoka
(74) *Attorney, Agent, or Firm*—Baker Botts L.L.P.

(57) ABSTRACT

A suspended transmission line with an embedded signal channeling device includes a support layer and a conductor supported by the support layer between first and second plates each having a ground plane. The conductor includes a combined signal line and a plurality of discrete signal lines extending from the combined signal line. The discrete signal lines each transmit a portion of a signal transmitted on the combined signal line. A propagation structure is disposed between the first and second plates to substantially contain an electromagnetic field generated by the propagating signal.

14 Claims, 5 Drawing Sheets

U.S. PATENT DOCUMENTS

| | | |
|---|---|---|
| 5,712,607 A | 1/1998 | Dittmer et al. ............. 333/238 |
| 5,760,744 A | 6/1998 | Sauer .................. 343/700 MS |
| 5,767,808 A | 6/1998 | Robbins et al. ...... 349/700 MS |
| 5,789,997 A | 8/1998 | Dekker ....................... 333/127 |
| 5,872,545 A | 2/1999 | Rammos ..................... 343/770 |
| 5,914,695 A | 6/1999 | Liu et al. ..................... 343/795 |
| 5,946,794 A | 9/1999 | Koizumi et al. .............. 29/600 |
| 6,081,988 A | 7/2000 | Pluymers et al. ............. 29/601 |
| 2002/0044098 A1 | 4/2002 | Von Stein et al. .......... 343/770 |

OTHER PUBLICATIONS

Wilkinson, E.J., "An N–Way Hybrid Power Divider," IRE Transactions on Microwave Theory and Techniques, vol. MTT–8, No. 1, pp. 116–118.

Saleh, A.A.M., "Planar Electrically Symmetric n–Way Hybrid Power Dividers/Combiners," IEEE Transactions on Microwave Theory and Techniques, vol. MTT–28, No. 6, pp. 555–563., Jun., 1980.

Green, H.E., "The Numerical Solution of Some Important Transmission–Line Problems," IEEE Transactions on Microwave Theory and Techniques, vol. MTT–13, No. 5, pp. 676–692., Sep., 1965.

Fromm, W.E., "Characteristics and Some Applications of Stripline Components," IEEE Transactions on Microwave Theory and Techniques, vol. MTT–3, No. 2, pp. 13–19., Mar., 1955.

Saleh, A.A.M., Computation of the Frequency Response of a Class of Symmetric N–Way Power Dividers, Bell System Technical Journal, vol. 59, No. 8, pp. 1493–1512., Oct., 1980.

Mosko, United States Statutory Invention Registration H27, "*Integrable Broadside Power Divider*," filed Sep. 3, 1985, published Feb. 4, 1986.

M. Saito, et al, XP–002172854, "*UHF TV Tuner Using PC Board with Suspended Striplines,* " IEEE Transactions on Consumer Electronics, vol. CE–24, No. 4, Nov. 1978, pp. 553–559.

Peter, R., et al, "*High–Performance HEMT Amplifiers with a Simple Low–Loss Matching Network*," IEEE Transactions on Microwave Theory and Techniques, vol. 39, Sep. 1, 1991, No. 9, New York, US, pp. 1673–1675.

SUSPENDED TRANSMISSION LINE WITH EMBEDDED SIGNAL CHANNELING DEVICE

RELATED APPLICATIONS

This application is a continuation of U.S. patent application Ser. No. 09/548,686 filed Apr. 13, 2000 by James R. Sherman and Elvin C. Chou and entitled "Suspended Transmission Line with Embedded Signal Device"

This application is related to U.S. patent application Ser. No. 09/548,691 entitled "Suspended Transmission Line with Embedded Amplifier," U.S. patent application Ser. No. 09/548,467 entitled "Suspended Transmission Line and Method," U.S. patent application Ser. No. 09/548,578 entitled "Integrated Broadside Conductor for Suspended Transmission Line and Method," and U.S. patent application Ser. No. 09/548,689 entitled "Method for Fabricating Suspended Transmission Line," all filed on Apr. 13, 2000.

TECHNICAL FIELD OF THE INVENTION

This invention relates generally to the field of signal transmission systems, and more particularly to a suspended transmission line with an embedded signal channeling device.

BACKGROUND OF THE INVENTION

Microwave and radio frequency circuits are generally implemented by interconnecting amplifiers, antennas, transmitters, receivers, and other components by a series of transmission lines. The transmission lines propagate microwave and radio frequency energy between the components of the circuit.

Transmission lines are generally implemented as waveguide pipes, striplines, and/or coaxial cables. Waveguide pipes are often impractical, however, because of the difficulty of installation and the size and weight is excessive for many applications. Striplines and coaxial cables are more compact and easier to install, but use special materials and fabrication processes that lead to high transmission line cost.

Further adding to the expense of microwave and radio frequency circuits is the expense of implementing amplifiers, antennas, splitters, combiners, and other components within the circuit. Typically, each component is implemented in a specially fabricated mechanical housing such as an aluminum box having signal, digital, and power connectors. These mechanical housings must generally be designed, engineered, and machined with tight tolerances for microwave and other high frequency applications. In addition, drawing packages need to be generated and maintained for each application. Connectors must also be thermally matched to the mechanical housing.

SUMMARY OF THE INVENTION

The present invention provides a transmission line signal channeling device that substantially eliminates or reduces the problems and disadvantages associated with prior methods and systems. In particular, the signal channeling device is embedded into a suspended transmission line to divide or combine signals in cellular and other suitable frequency applications.

In accordance with one embodiment of the present invention, a suspended transmission line with an embedded signal channeling device includes a support layer and a conductor supported by the support layer between first and second plates each having a ground plane. The conductor includes a combined signal line and a plurality of discrete signal lines extending from the combined signal line. The discrete signal lines each transmit a portion of a signal transmitted on the combined signal line. A propagation structure is positioned between the first and second plates to substantially contain an electromagnetic field generated by the propagating signal.

More specifically, in accordance with a particular embodiment of the present invention, the discrete signal lines include first and second outside lines and a center line between the first and second outside lines. The center line includes a serpentine element to maintain substantially the same length, and thus phase, as the first and second outside lines.

Technical advantages of the present invention include providing a low cost and space efficient transmission system. In particular, a signal channeling device is embedded into a transmission line substantially without degradation in the height of the transverse cross-section of the line. As a result, the transmission line structure is self-contained and includes fewer parts. The cost of designing, engineering, constructing, and maintaining separate mechanical housings for a divider or a combiner is minimized.

In accordance with the present invention there is provided an improved signal channeling device for cellular and other suitable frequency applications. In particular, the signal channeling device is embedded within and integral with a suspended transmission line. The resulting channeling device provides good isolation and VSWR, as well as low insertion loss. In addition, the number of transmission line connectors for the channeling device is reduced. Thus, antenna and other systems using dividers and/or combiners may be constructed at relatively low cost.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
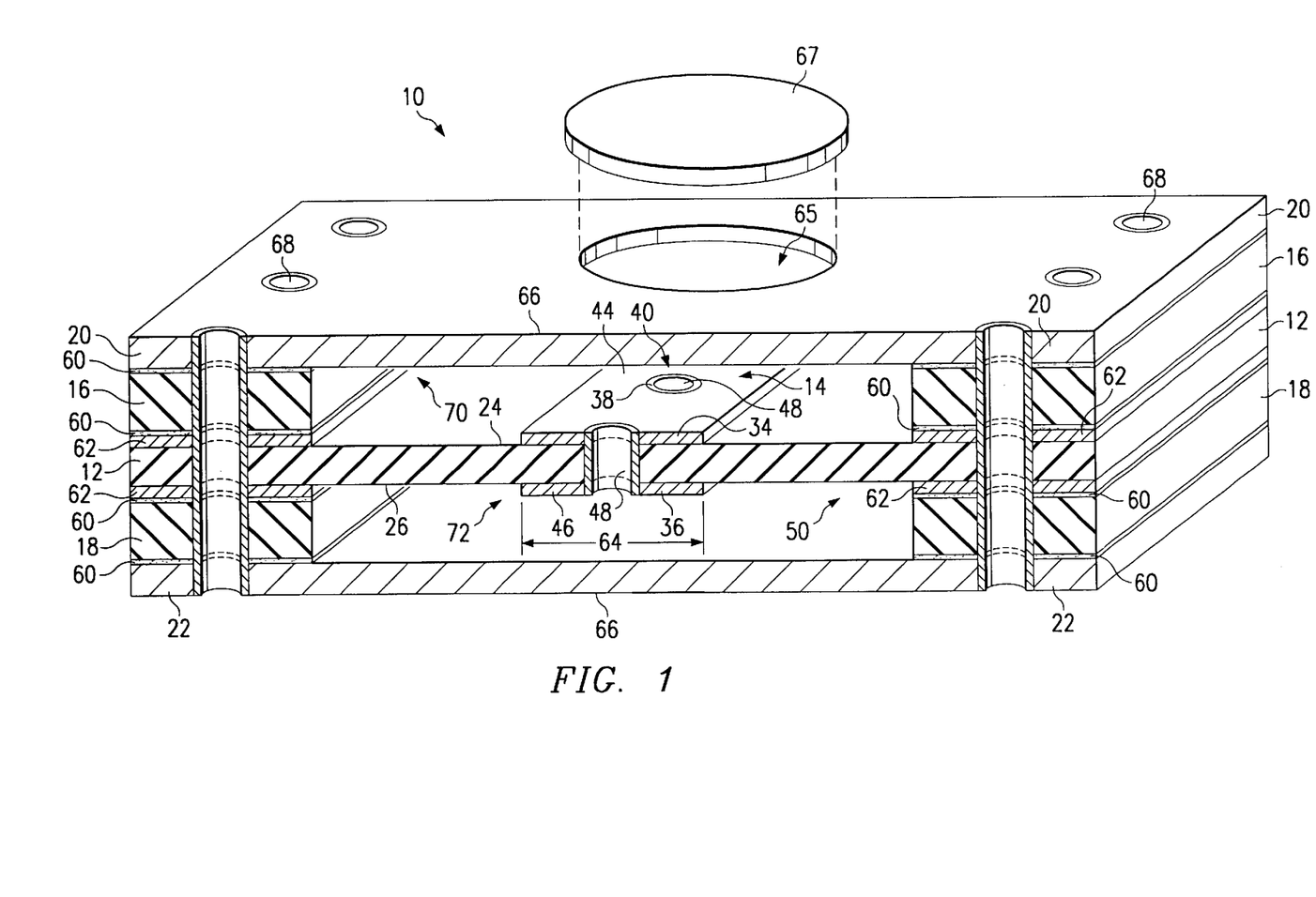
FIG. 1 is a sectional diagram illustrating a suspended transmission line in accordance with one embodiment of the present invention.

FIG. 1 illustrates a suspended transmission line 10 in accordance with one embodiment of the present invention. In this embodiment, the suspended transmission line 10 is used to transmit microwave and other radio frequency signals in a transmission system. As described in more detail below, an amplifier, power divider, or other active or passive device may be embedded into the transmission line 10 to manipulate a transmitted signal. The transmitted signal may be an outgoing signal being transmitted to an antenna or incoming signal being received from an antenna. It will be understood that the suspended transmission line 10 may be otherwise suitably configured for use in microwave, radio frequency and other suitable high power or other applications.

Referring to FIG. 1, the suspended transmission line 10 includes a support layer 12 supporting a center conductor 14, first and second spacers 16 and 18 each disposed on opposite sides of the support layer 12, and first and second plates 20 and 22 each disposed outwardly of a corresponding spacer 16 or 18. As described in more detail below, each of the layers 12, 16, 18, 20, and 22 may be separately fabricated and thereafter laminated together to form the suspended transmission line 10.

The support layer 12 is a thin dielectric sheet having a first side 24 and an opposite second side 26. The thickness of the support layer 12 is preferably minimized to a thickness needed to support the center conductor 14 in order to minimize the cross section of the support layer 12 and thus limit electrical fields in the layer 12. The support layer 12 may be continuous or include openings (not shown) to control propagation characteristics of the suspended transmission line 10. Layers 20 and 22 may also contain holes to allow integration of components directly into the suspended transmission line 10, and the like.

The support layer 12 is fabricated from an inexpensive dielectric material which may have a moderate loss tangent as in a lossy material. The use of a lossy dielectric material for the support layer 12 avoids the necessity of exotic low-loss materials such as Alumina, Duroid, cross-linked polystyrene, and Beryllium Oxide previously used to support a conductor in a suspended transmission line. Although such low-loss materials improve insertion loss, such materials are typically very expensive. A lossy material is the material of preference because, as described in more detail below, the center conductor 14 is configured to direct an electric field generated by a signal on the center conductor 14 substantially away from the support layer 12 such that only fringing electrical fields cross the support layer 12. Dissipation losses due to the fringing electrical fields are minimal even in the lossy material of the support layer 12. As a result, the suspended transmission line 10 may be produced at relatively low cost and used in high power and high performance applications.

The lossy material of the support layer 12 is an epoxy glass such as G-10 or GFG, polyimide glass, or other suitable printed circuit board base materials such as polyester, or other suitable lossy materials. A lossy material has a moderate loss tangent of about 0.04 or less. In one embodiment, G-10 material is preferred for the support layer 12 because G-10 has good dimensional stability over a large temperature range and is easy to laminate and match to other layers and materials. In another embodiment, an incremental increase in performance is obtained by using low loss PTFE material in place of the G-10 for the support layer 12. Because the support layer 12 is thin, this results in only a small increase in cost.

The center conductor 14 is supported by the support layer 12 between the first and second plates 20 and 22. The first and second plates 20 and 22 provide the upper and lower plates and act as ground planes to the suspended transmission line 10. Plates 20 and 22 may be solid metal or a base substrate material with metal layers on both sides. The center conductor 14 transmits the signal with low dissipation loss. Accordingly, the suspended transmission line 10 has utility to carry a signal over long distances between amplifiers, antennas, transmitters, receivers, and other components in the transmission or receiver system.

The center conductor 14 includes a first part 34 exposed at the first side 24 of the support layer and a second part 36 exposed at the second side 26 of the support layer 12. The first and second parts 34 and 36 of the center conductor 14 preferably mirror each other to minimize in the support layer 12 the electric field generated by a signal transmitted on the center conductor 14.

A third part 38 of the center conductor 14 connects the first and second parts 34 and 36 at intermediate points 40 along the length of the center conductor 14. Connection of the first and second parts 34 and 36 at the intermediate points 40 produces equal phase and amplitude for a signal between the first and second parts 34 and 36 and reduces electric field coupling. As a result of this structure, the electric field generated by a transmitted signal is substantially directed away from the support layer 12 with only fringing electric fields in the support layer 12. Further details of a typical electric field distribution are described below in connection with FIG. 2.

Connection of the first and second parts 34 and 36 of the center conductor 14 at the intermediate points 40 means the first and second parts 34 and 36 are electrically connected to each other at least at spaced intervals along the length of the center conductor 14. Spacing between the intermediate points 40 is substantially equal along the length of the center conductor 14 and is based on the frequency of the signal to be transmitted by the suspended transmission line 10. In a particular embodiment, the center conductor 14 includes about 10 to 20 connections per wavelength of the transmitted signal frequency. It will be understood that other suitable spacing that maintains a substantially constant phase and amplitude for a signal on the center conductor 14 may be used.

In the illustrated embodiment, the center conductor 14 is an integrated broadside conductor. For this embodiment, the first part 34 of the center conductor 14 is a first conductive strip 44 disposed on the first side 24 of the support layer and the second part 36 of the center conductor 14 is a second conductive strip 46 disposed on the second side 26 of the support layer 12. The first and second conductive strips 44 and 46 are copper or silver-plated copper or other suitable metal traces that minimize conductor resistivity. The third part 38 of the center conductor 14 comprises a plurality of broadside connectors 48 each extending through the support layer 12 between the first and second conductive strips 44 and 46 to electrically couple the strips 44 and 46 at an intermediate point 40. Unless otherwise specified, the use of the term each herein means each of at least a subset of the identified items. The connectors 48 are copper or silver-plated copper vias or other suitable conductive connectors.

The first and second spacers 16 and 18 maintain the plates 20 and 22 in space relation with the support layer 12, and thus the center conductor 14, to form a propagation structure 50 encompassing the center conductor 14 with air and ground planes for Quasi-TEM mode of propagation. The propagation structure 50 encompasses the center conductor 14 in that it is over, including above and/or below the conductor 14 up to and beyond the upper and lower ground plates 20 and 22. As described in more detail below, the propagation structure 50 provides a low-loss medium for propagation of the electromagnetic field generated by a transmitted signal. Accordingly, dissipation losses are minimized along the suspended transmission line 10.

The first and second spacers 16 and 18 may each be continuous along the propagation structure 50 or comprise a plurality of discrete posts or other suitable structures operable to maintain the plates 20 and 22 in space relation from the center conductor 14. The spacers 16 and 18 are sized such that substantially all of the electromagnetic field generated by a transmitted signal around the center conductor 14 is maintained in the propagation structure 50. Thus, as described in more detail below, spacer geometry is dependent on the transmitted signal frequency as well as the size, geometry, and materials of the support layer 12, center conductor 14, plates 20 and 22, and propagation structure 50.

The first and second spacers 16 and 18 are each fabricated of a dielectric, conductor, or other suitable material or materials. Preferably, the sidewalls of the spacers 16 and 18 are spaced apart and away from the center conductor 14 to minimize the effect on the electromagnetic field in the propagation structure 50. This minimizes the changes in impedance along the direction of propagation. In addition, the spacer material preferably has a coefficient of thermal expansion equal or at least similar to the material of the support layer 12 so that the suspended transmission line 10 has good mechanical stability over a large temperature range. In a particular embodiment, the support layer 12 and spacers 16 and 18 are each fabricated of G-10 material.

For the illustrated embodiment, each spacer 16 and 18 includes adhesion layers 60 at each edge for connecting the spacers to the support layer 12 and the plates 20 and 22. The support layer 12 includes a metalization layer 62 on each side 24 and 26. The metalization layers 62 form the point of attachment of the mode suppression connection vias 68. These minimize the impedance altering effects of the potential higher order modes and reduce electromagnetic coupling between alternate board routes. In this embodiment, the first spacer 16 is attached to the metalization layer 62 on the first side 24 of the support layer 12 to separate the first plate 20 from the center conductor 14. The second spacer 18 is attached to the metalization layer 62 on the second side 26 of the support layer 12 to separate the second plate 22 from the center conductor 14. Both layers 62 on 24 and 26 are attached to the connection vias 68.

The first and second plates 20 and 22 may consist entirely of conductive metal such as copper or may consist of a lossy dielectric with copper or silver-plated copper or other suitable metal with low resistivity on each side. These plates form the ground plane 66 disposed over the center conductor 14. The ground planes 66 of the plates 20 and 22 and the underlying conductive strips 44 and 46 of the center conductor 14 together generate the electromagnetic field in the propagation structure 50. Variations in spacing of the ground plane 66 from the center conductor 14 may be offset by the line width 64 of the center conductor 14 in order to maintain a substantially constant impedance in the center conductor 14. Spacing variations may be caused by access openings 65 cut in the ground plane 66 to allow insertion and integration of a device into the suspended transmission line 10. In this case, the access opening is illustrated covered by a magnetic or other ground cover 67 secured flush with the outside of the plate 20 or 22.

In the illustrated embodiment, the plates 20 and 22 comprise a conductive material and each form a continuous ground plane 66. In a particular embodiment, the plates 20 and 22 are copper plates having a thin outer tin layer (not shown) to reduce corrosion and improve solderability. The first plate 20 is attached outwardly of the first spacer 16 to form a first propagation cavity 70 between the first plate 20 and the first conductive strip 44 of the center conductor 14. The second plate 22 is attached outwardly of the second spacer 18 to form a second propagation cavity 72 between the second plate 22 and the second conductive strip 46 of the center conductor 14. In this embodiment, the first and second propagation cavities 70 and 72 form the propagation structure 50.

The propagation cavities 70 and 72 each provide a low-loss medium for propagation of the electromagnetic field generated by a transmitted signal on the center conductor 14. The low-loss medium is a medium that propagates the electromagnetic field with a dissipation loss on the order of about 0.1 dB/inch or below at microwave frequencies. In the illustrated embodiment, the propagation cavities 70 and 72 are each an air cavity. To prevent moisture from entering the suspended transmission line 10, the propagation cavities 70 and 72 may include closed cell foam or other suitable low-loss material to displace the air and reduce overall moisture content.

A plurality of mode suppression connectors 68 are formed on either side of the propagation structure 50 to eliminate or reduce interference between the suspended transmission line 10 and nearby or adjacent transmission lines and other devices or circuits in the transmission system. The mode suppression connectors 68 are spaced in accordance with conventional techniques. In one embodiment, the mode suppression connectors 68 are tin plated copper vias extending through the support layer 12 and spacers 16 and 18 between the plates 20 and 22. The mode suppression connectors 68 are attached to the metalization layers 62 for additional mechanical support and improved mode suppression.

For the suspended transmission line 10, the geometry, size, and material of the support, spacer, and plate layers 12, 16, 18, 20 and 22 and of the center conductor 14 and propagation cavities 70 and 72 are dependent on the frequency of a signal to be transmitted by the line 10. The relationship between the maximum transmitted signal frequency and the materials and geometry of the suspended transmission line 10 dictate that the transmission line 10 should be operated below the first cut-off frequency of the potential higher order modes. The onset of the first higher order mode may be approximated by frequency equations for rectangular waveguide and for non-integrated suspended stripline. The frequency equation for rectangular waveguide is as follows:

$$f_c = \frac{c0}{2 \cdot a}$$

where:
  $f_c$=TE10 mode cut-off frequency
  c0=the speed of light in a vacuum
  a=the enclosure (waveguide) width The frequency equation for non-integrated suspended striplines is as follows:

$$f_c = \frac{c0}{2 \cdot a} \sqrt{1 - \frac{h}{b}\left[\frac{e_{r-1}}{e_r}\right]}$$

where:

$f_c$=1st higher order mode cut-off frequency c0=the speed of light in vacuum a=the enclosure width b=the enclosure height h=the supporting substrate height $e_r$=the relative dielectric constant of the dielectric support layer These equations provide a close estimation of values for the suspended transmission line 10, with the non-integrated suspended stripline equation generally providing a closer approximation due to the low cut-off frequency of the suspended transmission line 10. Other factors have been known to change the cut-off frequency of the suspended transmission line 10. Such factors include the size and spacing of the mode suppression connectors 68 and the size and spacing of the broadside connectors 48.

In one embodiment, values obtained for a particular implementation of the suspended transmission line 10 from the equations may be fine tuned using conventional computer simulation techniques and programs, modified to account for the configuration of the suspended transmission line 10. Suitable programs include ANSOFT EXTRACTOR for 2-D analysis and ANSOFT HFSS (High Frequency Structure Simulator) for 3-D analysis. Further modeling may be done using the BRCTL mode of the HP MDS LINECALC model. The LINECALC model is normally used for a pair of coupled lines as opposed to a single transmission line with mode voltages identical at any cross-section. In the BRCTL model, the even mode characteristic impedance is used as twice the characteristic impedance of the suspended transmission line 10 to account for the dual parallel configuration of the center conductor 14. In addition, because the space between the first and second conductive strips 44 and 46 has nearly the same potential as the first and second conductive strips 44 and 46 when they are held at the same potential by the connectors 48, the first and second conductive strips 44 and 46 can be regarded as an approximation to a single thick conductor. Accordingly, the thickness of the conductive strips 44 and 46 must be accounted for in impedance calculations. Other modes of the MDS LINECALC model, finite element analysis, and other suitable techniques are available to simulate and design the suspended transmission line 10.

In a particular microwave embodiment of the suspended transmission line 10, the support layer 12 comprises G-10 material having a relative dielectric constant of 4.5 and a thickness of 8 mils. In this particular embodiment, the first and second spacers 16 and 18 each comprise G-10 material and with the adhesion layers 60 having a thickness of 38 mils. The plates 20 and 22 are each copper and have a thickness of 20 mils. Each propagation cavity 70 and 72 has an enclosure width of 240 mils and an enclosure height of 38 mils. The center conductor 14 has an impedance of 50 ohms and comprises of copper plated silver traces 44 and 46 on each side 24 and 26 of the support layer and plated silver connectors 48 extending through the support layer 12 between the silver-plated traces 44 and 46. The silver-plated traces 44 and 46 each have a thickness of 1.5 mils and a line width of 20 mils. The connectors 48 have a diameter of 13 mils and are each spaced approximately 100 mils apart. The suspended transmission line 10 of this embodiment has a cut off frequency of 14.2 GHz and an upper useful range of about 14 GHz, which provides a margin to account for manufacturing tolerances. Testing of this suspended transmission line 10 showed an insertion loss of 0.02 dB per inch at 1 GHz, an insertion loss is 0.05 dB per inch at 5 GHz, an insertion loss of 0.12 dB per inch at 10 GHz, and an insertion loss of 0.55 dB per inch at 15 GHz.

Figure 2:
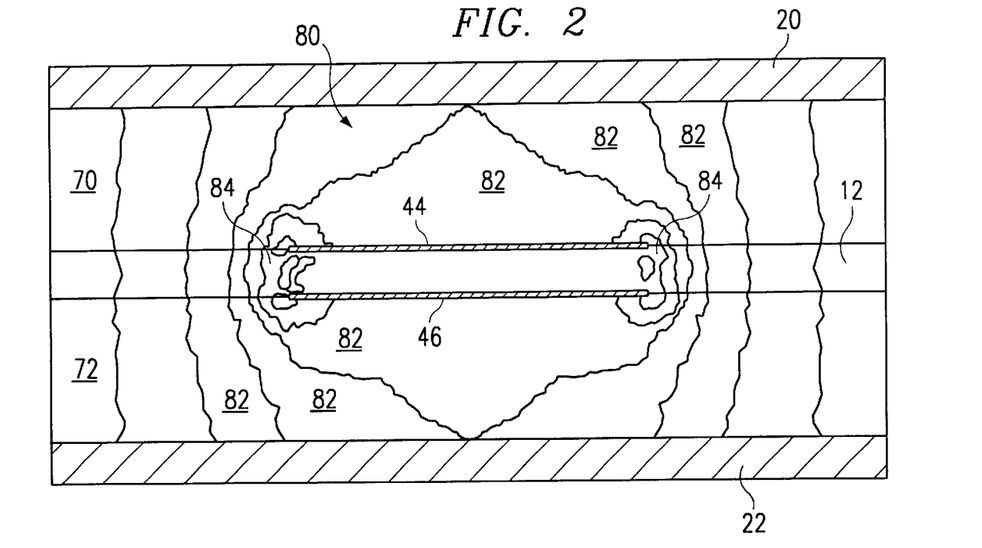
FIG. 2 is a sectional diagram illustrating distribution of an electric field in the suspended transmission line of FIG. 1.

FIG. 2 illustrates distribution of an electric field 80 in the suspended transmission line 10. As previously described, the electric field 80 is generated by a propagating electromagnetic signal around the center conductor 14. This signal may be a microwave, radio, or other suitable frequency signal.

Referring to FIG. 2, the electric field 80 includes a transverse field 82 generally perpendicular to the conductive strips 44 and 46 and small fringing fields 84 in the support layer 12 at the edges of the conductive strips 44 and 46. The transverse field 82 comprises the significant part of the electric field 80 and is propagated in the low-loss medium of the propagation cavities 70 and 72. Accordingly, dissipation or insertion losses are minimal and limited to losses in the fringing field 84.

Figure 3:
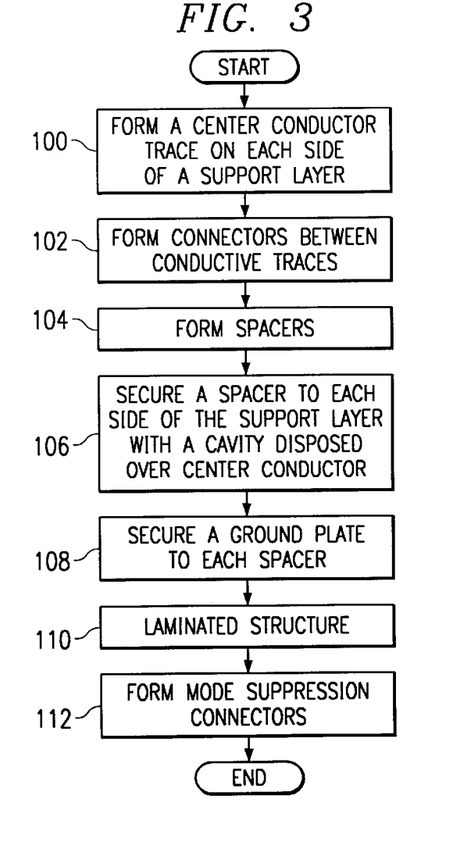
FIG. 3 is a flow diagram illustrating a method for fabricating the suspended transmission line of FIG. 1 in accordance with one embodiment of the present invention.

FIG. 3 is a flow diagram illustrating a method for fabricating the suspended transmission line 10 of FIG. 1 in accordance with one embodiment of the present invention. In this embodiment, the support, spacer, and ground layers 12, 16, 18, 20, and 22 are separately fabricated and thereafter laminated together to form the suspended transmission line 10. It will be understood that the suspended transmission line 10 may be otherwise fabricated and comprise other materials without departing from the scope of the present invention.

Referring to FIG. 3, the method begins at step 100 in which the conductive traces 44 and 46 are formed on each side 24 and 26 of the support layer 12. In one embodiment, copper on support layer 12 is patterned and etched to form the conductive traces 44 and 46. The silver is plated on the resultant copper traces. In this embodiment, the silver plating may be applied outside or at the edges of the cavities 70 and 72 to form the metalization layers 62 and provide an intermediate ground plane on each side 24 and 26 of the support layer 12. The support layer 12 is cut to size before or after formation of the conductive traces 44 and 46.

Proceeding to step 102, connectors 48 are formed in the support layer 12 between the first and second conductive strips 44 and 46. In one embodiment, the connectors 48 are formed by drilling vias at the intermediate points 40 along the conductive strips 44 and 46 and plating the vias with copper. These vias are then silver plated. As previously described, the connectors 48 provide equal phase and amplitude for a signal between the first and second conductive strips 44 and 46 to reduce electric field coupling. The reduced electric field coupling between conductive strips 44 and 46 lead to reduced insertion loss.

Next, at step 104, the first and second spacers 16 and 18 are each formed by a pair of opposing strips routed or otherwise formed from a spacer layer. The spacer layer preferably comprises an inexpensive material that is thermally matched to the support layer 12.

At step 106, the spacers 16 and 18 are each laminated to opposite sides 24 and 26 of the support layer 12. The strips for each spacer are positioned along edges of the support layer 12 and displaced from the center conductor 14 to form the propagation cavities 70 and 72. In one embodiment, the spacers 16 and 18 are laminated to the support layer 12 using a conventional no-flow or low-flow B-stage process. In the B-stage process, partially cured epoxy with glass cloth reinforcement is attached to the support layer 12 and becomes part of overlying spacer 16 or 18. The geometry of the glass cloth reinforcement matches that of the overlying spacer 16 or 18 so as to not interfere with the cavity 70 or 72. The no-flow or low-flow characteristics of the partially cured epoxy prevents or minimizes epoxy flow into the cavities 70 or 72.

Proceeding to step 108, the ground plates 20 and 22 are each formed and attached to a spacer 16 or 18. In one embodiment, each ground plate 20 and 22 is laminated to the respective spacer 16 or 18 using the no-flow or low-flow B-stage process previously described in connection with step 106. The plates 20 and 22, in connection with the spacers 16 and 18 and the support layer 12, form the propagation cavities 70 and 72.

Next, at step 110, the laminated layers are pressed together and heated to cure the epoxy and form the basic structure of the suspended transmission line 10. For the low-flow B-stage process, the layers may be pressed together at a pressure of 250–300 psi and heated at a temperature of 350 degrees Fahrenheit for 90 minutes.

At step 112, the mode suppression connectors 68 are formed for the suspended transmission line 10. In one embodiment, the mode suppression connectors 68 are each formed by drilling a via through the plates 20 and 22, spacers 16 and 18, and support layer 12, and plating the vias with copper. In this embodiment, the vias preferably have a diameter greater than 0.04 inches to allow copper and tin plating through the entirety of the vias. In this way, the suspended transmission line 10 is efficiently fabricated further reducing transmission line cost. In addition, conventional multi-layer printed circuit board fabrication techniques may be used in fabrication of the suspended transmission line 10 eliminating the need for the development and testing of new techniques and equipment.

Figure 4:
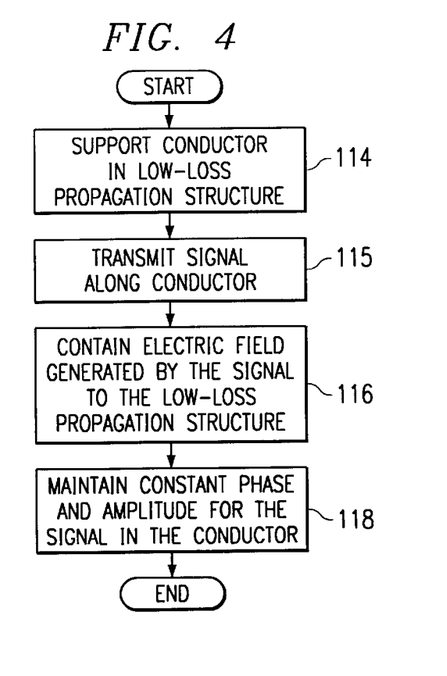
FIG. 4 is a flow diagram illustrating a method for transmitting a signal in the transmission line of FIG. 1 in accordance with one embodiment of the present invention.

FIG. 4 illustrates a method for transmitting a signal in the suspended transmission line 10. The method begins at step 114 in which the conductor 114 is supported in the low-loss propagation structure 50. As previously described, the low-loss propagation structure includes air cavities 70 and 72 formed above and below the conductor 14.

Proceeding to Step 115, a signal is transmitted along the conductor 14. At step 116, an electric field generated by the signal is substantially contained to the low-loss propagation structure 50. In addition, at step 118, a substantially constant phase and amplitude for the signal is maintained in the conductor 14. Accordingly, line losses are minimized in the suspended transmission line 10.

Figure 5:
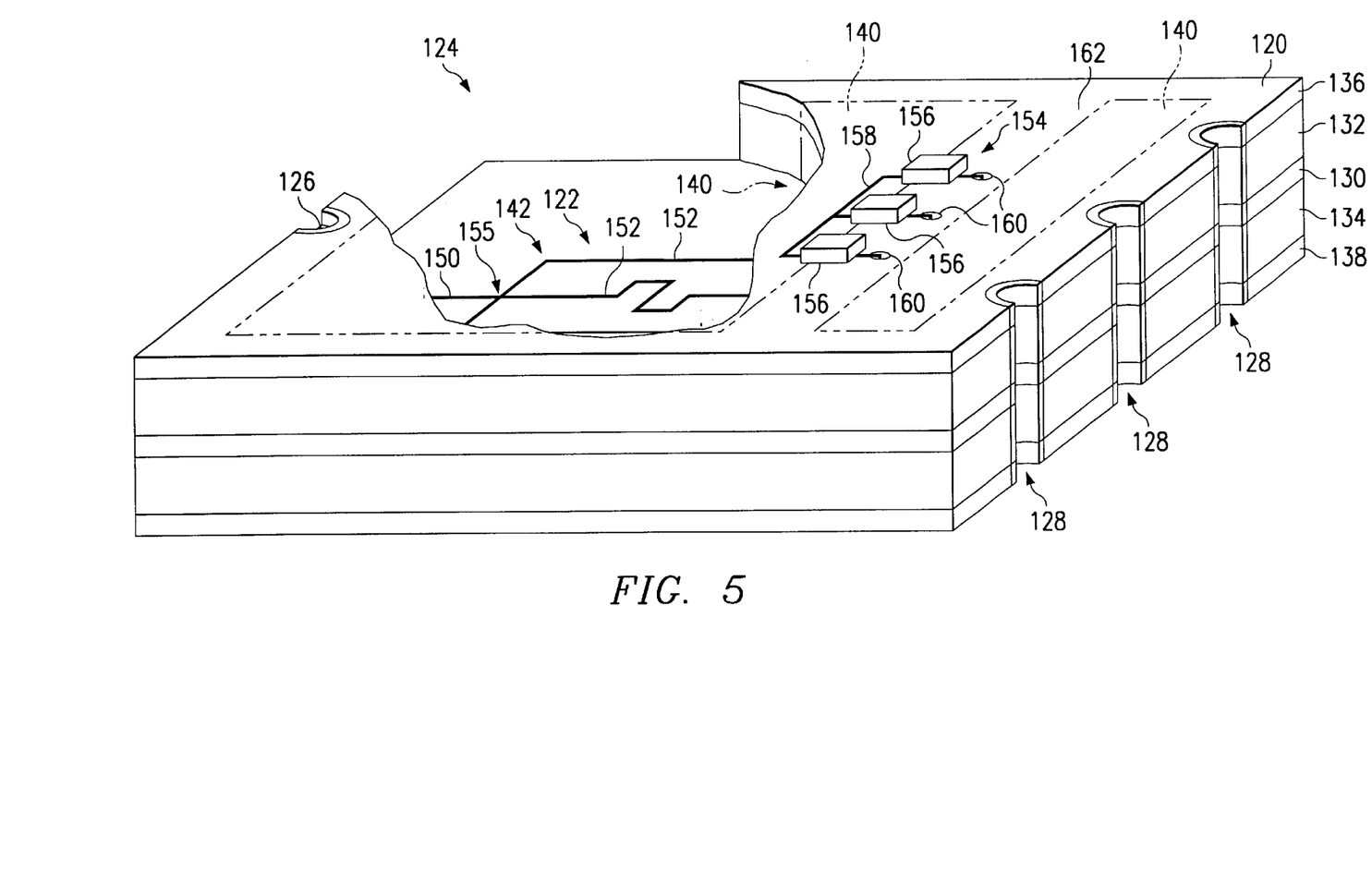
FIG. 5 is a perspective diagram illustrating a signal channeling device embedded into a suspended transmission line segment in accordance with one embodiment of the present invention.

FIG. 5 illustrates a suspended transmission line segment 120 having an embedded signal channeling device 122 in accordance with one embodiment of the present invention. In this embodiment, the suspended transmission line segment 120 and embedded signal channeling device 122 form a power divider 124 with a radio frequency (RF) input port 126 and a plurality of RF output ports 128 that allow connection into existing transmission systems with coaxial cable. Use of the power divider 124 substantially eliminates design, engineering, construction, and maintenance costs associated with a separate mechanical housing for the signal channeling device 122. Further use of the suspended transmission line structure as the transmission line substantially eliminates the need for the RF connectors 126 and 128 and further reduces cost while improving performance by minimizing line losses associated with the RF connectors.

Figure 6:
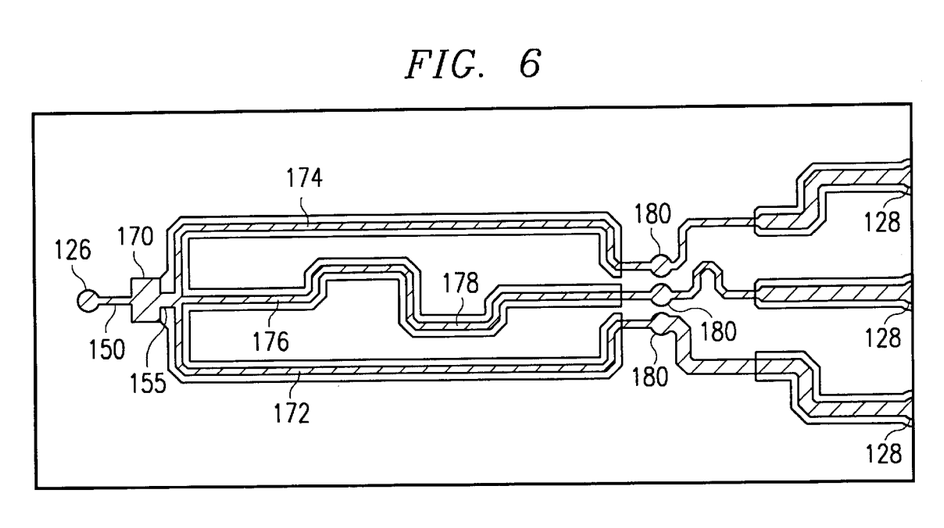
FIG. 6 is a schematic diagram illustrating the configuration of the center conductor for the embedded signal channeling device of FIG. 4 in accordance with one embodiment of the present invention.

Referring to FIGS. 5 and 6, the transmission line segment 120 includes a support layer 130, first and second spacers 132 and 134, and first and second plates 136 and 138. In one embodiment, the support, spacer, and plate layers 130, 132, 134, 136, and 138 are fabricated from materials and configured as previously described in connection with corresponding layers of the suspended transmission line 10. The various parts of the transmission line segment 120 are laminated together and form a low-loss propagation structure 140 enclosing a conductor 142 supported by the support layer 130. The conductor 142 is an integrated broadside conductor and extends from the RF inlet port 126 to the REF outlet ports 128. Mode suppression connectors are formed as also described in connection with the suspended transmission line 10.

For the illustrated embodiment, the signal channeling device 122 is a floating node three-way Wilkinson divider.

In this embodiment, the signal channeling device 122 includes a combined signal line 150, three discrete signal lines 152, and an interference blocking system 154. The discrete signal lines 152 extend from a junction 155 with the combined signal line 150 and are each operable to transmit a portion of a signal transmitted on the combined signal line 150. The combined and discrete signal lines 150 and 152 are formed by the conductor 142 and each include a first conductive trace formed on a first side of the support layer 130, a second conductive trace formed on a second side of the support layer 130, and a plurality of connectors that each connect the first and second conductive traces at intermediate points along the length of the line 150 or 152. The conductive traces and connectors are formed as previously described in connection with corresponding elements of the center conductor 14 of the suspended transmission line 10.

The interference blocking system 154 absorbs downstream power backing up to the discrete signal lines 152. The interference blocking system 154 includes, for each discrete signal line 152, a 50 Ohm or other suitable power resistor 156 connecting the line 152 to a floating node 158. The power resistors 156 are preferably disposed on the outside of the first plate 136 to provide good heat dissipation and accommodate the geometry of the suspended transmission line segment 120. In a particular embodiment, the power resistors 156 are each coupled to one of the discrete signal lines 152 through a connector 160 and pad 180. The connectors 160 each extend from a power resistor 156 through the first plate 136 and a supporting projection 162 of the first spacer 132 that interrupts the propagation structure 140. The interference blocking system 154 may comprise other suitable elements, be otherwise suitably configured, or be otherwise suitably integrated with the suspended transmission line segment 120.

FIG. 6 illustrates details of the combined and discrete signal lines 150 and 152 (FIG. 5) of the floating node three-way Wilkinson divider. The Wilkinson divider splits an input signal into three output signals. Second stage Wilkinson dividers are interconnected to further split each output signal of an upstream divider into three additional signals.

Referring to FIG. 6, the combined signal line 150 extends from the input port 126 to the junction 155 with the discrete signal lines 152. The combined signal line 150 includes a capacitive input section 170. The capacitive input section 170 tunes out the power resistor 156 (FIG. 5) parasitic capacitance at the front end of the power divider 124 (FIG. 5).

The discrete signal lines 152 include first and second outside pathways 172 and 174 and a center pathway 176.

The pathways 172, 174, and 176 are configured and sized to provide a 90 degree or other suitable phase shift of, and a 77 Ohm or other suitable impedance to, a signal transmitted on the combined signal line 150. This is accomplished by maintaining a constant impedance of approximately 77 Ohms. The impedance is not restricted to this value and may in some cases be closer to 86.6 Ohms for the pathways 172, 174 and 176. The outside and center pathways 172, 174, and 176 each extend from the junction 155 with the combined signal line 150 to a separate RF output port 128 which has a linewidth that produces an impedance of approximately 50 Ohms. The impedance of these lines maintains a low VSWR. The first and second outer pathways 172 and 174 substantially mirror each other on opposite sides of the center pathway 176. The center pathway 176 includes a serpentine element 178 to maintain a length substantially equal to that of the outside pathways 172 and 174. Equal length of the outside and center pathways 172, 174, and 176 produce a substantially constant phase shift in each pathway. Accordingly, a signal transmitted on the combined signal line 150 is equally split between the pathways 172, 174, and 176.

The power resistors 156 (FIG. 5) are connected to each of the outside and center pathways 172, 174, and 176 by the connectors 160 (FIG. 5) at nodes 180. As previously described, the power resistors 156 absorb downstream power backing up to the pathways 172, 174, or 176.

In a particular embodiment, the power divider 124 is used to feed a cellular antenna with multiple discrete antennas at a frequency of 800 MHz. For a 100-watt conductor 142, the power resistors 156 are BeO resistors. BeO resistors may be used because of their excellent thermal dissipation when mounted on first plate 136 (FIG. 5). The combined signal stripline 150 has a line width of 44 mils and length of 57 mils from the input port 126 to the capacitive input section 170. The capacitive input section 170 has a width of 200 mils and a length of 150 mils. From the stripline capacitive input section 170 to the junction 155 with the discrete signal lines 152, the combined signal stripline 150 has a line width of 76 mils and length of 100 mils. For the discrete signal suspended transmission lines 152, the outside and center pathways 172, 174, and 176 each have a line width of 30 mils and a length of a quarter wavelength from the junction 155 with the combined signal line 150 to the resistor connect nodes 180. The propagation structure 140 (FIG. 5) comprises a first air cavity above the conductor 142 (FIG. 5) and a second air cavity below the conductor 142. Each air cavity has a width of about 3 to 5 times line width of the outside and center pathways 172, 174, and 176 mils and a height of 86.5 mils. From the resistor connect nodes 180, the pathways 172, 174, and 176 each extend to a separate one of the RF output ports 128. At the output ports 128, each divided signal has a frequency of 800 MHz. The power divider 124 (FIG. 5) may be otherwise suitably configured or formed in a segment of a suspended transmission line or in an extended run of a suspended transmission line.

Figure 7:
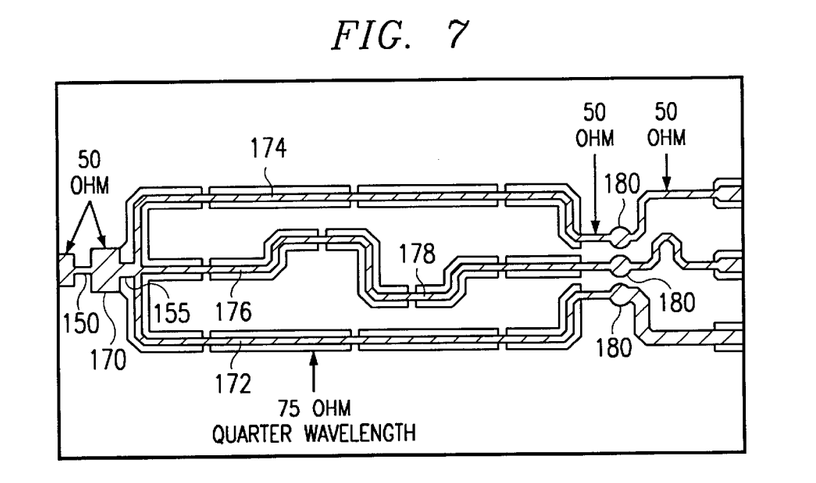
FIG. 7 is a schematic diagram illustrating further details of the suspended transmission line in accordance with one embodiment of the present invention.

FIG. 7 illustrates further details of the combined and discrete signal lines 150 and 152 (FIG. 5) of the floating node 3-way Wilkinson divider in accordance with one embodiment of the present invention. In this embodiment, the input and output are 50 Ohms suspended transmission line from other circuitry or the input port 126 (FIG. 5) and output port 128 (FIG. 5), respectively. The input and output structures are in stripline for mechanical support. These structures are 50 Ohms, as short as possible. In addition, periodic mechanical support is provided in the suspended transmission lines. The periodic mechanical support comprises first and second spacers 132 and 134 (FIG. 5). The arms are quarter wavelength and 77 Ohms due to minimum widths.

The support projection 162 (FIG. 5), in the areas for the resistor 156 (FIG. 5), connector 160 (FIG. 5) and the pad 180, may be solid filled G-10 board. Stripline, solid filled G-10 board, also forms a supporting projection for the areas of the input port 126 and the output port 128. The cavity area, which also demarcates the suspended transmission line, is illustrated as a dotted line. Additional periodic smaller supports are shown in the cavity area to keep the line suspended as necessary.

The characteristic impedance of the different lines is labeled. The characteristic impedance describes the electrical characteristics of the lines and determines the geometric proportion of the line elements: i.e., line width in proportion to cavity height. Therefore it can be scaled. Similarly, the line length is labeled in terms of number of wavelengths. The discrete signal lines 152, each have a characteristic impedance of 77 Ohms and a length of a quarter-wavelength for any given frequency. While, a characteristic impedance of 86.6 Ohms may be preferred, it makes the lines too narrow for power handling. The copositive input section 170 has a characteristic impedance and length as required for compensating out parasitics and nonidealities (such as a 77 Ohm line instead of an 86.6 Ohm line). All the other lines on the inputs and outputs are 50 Ohms and their lengths are as required.

Figure 8:
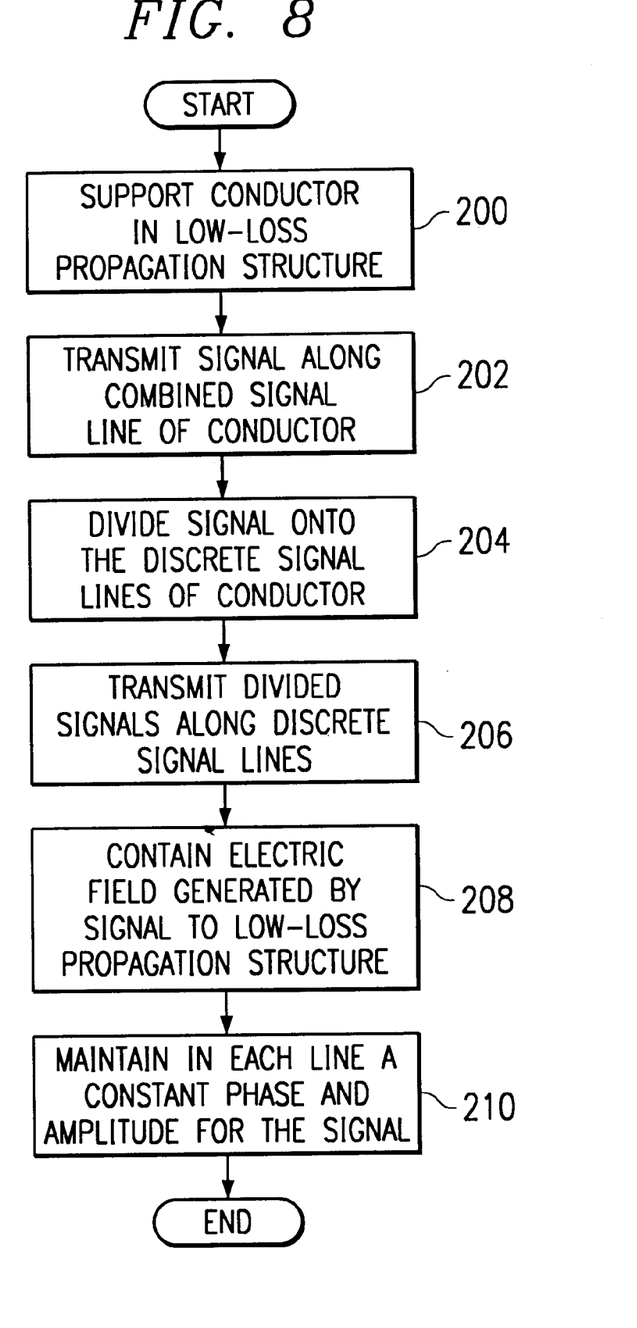
FIG. 8 is a flow diagram illustrating a method for dividing a signal in a transmission line in accordance with one embodiment of the present invention.

FIG. 8 illustrates a method for dividing a signal in the power divider 124. The method begins at step 200 to support the conductor 142 in the low-loss propagation structure 140 of the suspended transmission line segment 120. Next, at step 202, a signal is received at the input port 126 and transmitted along the combined signal line 150 of the conductor 142.

Proceeding to step 204, the signal is divided onto the discrete signal lines 152 of the conductor 142. As previously described, the discrete signal lines 152 include outside pathways 172, 174, and a center pathway 176. The pathways 172, 174, and 176 are each of substantially equal length and provide a substantially constant phase shift of the transmitted signal. At step 206, the divided signals are each transmitted along one of the pathways 172, 174, or 176 to a corresponding RF output port 128. From the RF output ports 128, the divided signals are each fed to an element of multiple antenna systems.

During operation, at step 208, an electromagnetic field generated by the transmitted signal is substantially contained by, or to, the low-loss propagation structure 140. In addition, in each of the combined and discrete signal lines 150 and 152, a substantially constant phase and amplitude is maintained for the signal on the line 150 or 152. Accordingly, line losses are minimized in the power divider 124. Step 210 leads to the end of the process by which the transmitted signal is divided for feed to multiple elements while minimizing line losses.

Although the present invention has been described with several embodiments, various changes and modifications may be suggested to one skilled in the art. It is intended that the present invention encompass such changes and modifications as fall within the scope of the appended claims.

What is claimed is:

1. A method for transmitting a signal in a transmission line, comprising:

supporting a conductor on a support layer;
positioning a first ground plane from a first side of the support layer in a spaced relationship, the spacing between the first ground plane and the first side selected to form a propagation structure;

positioning a second ground plane from a second side of the support layer in a spaced relationship, the spacing between the second ground plane and the second side selected to form a propagation structure;

transmitting a signal along a combined signal line of the conductor;

transmitting the signal from the combined signal line along a plurality of discrete signal lines of the conductor;

channeling the signal between the combined signal line and the plurality of discrete signal lines;

maintaining in each line a substantially constant phase and amplitude for the transmitted signal;

containing an electromagnetic field generated by the signal substantially to the low-loss propagation structure; and absorbing downstream power interference on each of the discrete signal lines.

2. The method of claim 1 further comprising tuning out parasitic capacitance at the input end of the combined signal line.

3. The method of claim 1 further comprising imparting a substantially equal phase to each signal transmitted on each of the plurality of discrete signal lines.

4. A method for transmitting a signal in a transmission line, comprising:

transmitting a signal along a combined signal line of a conductor supported on a low-loss propagation structure, the conductor supported on a support layer between first and second plates, each plate having a ground plane;

transmitting a portion of a signal transmitted on the combined signal line on each of a plurality of discrete signal lines of the conductor;

containing the electromagnetic field generated by the signal transmitted on the combined signal line and the plurality of discrete signal lines substantially to the low-loss propagation structure; and absorbing downstream power interference on each of the discrete signal lines.

5. The method of claim 4 further comprising imparting a substantially equal phase to each portion of the signal transmitted on each of the plurality of discrete signal lines.

6. The method of claim 4 further comprising providing a substantially constant phase for the signal transmitted on each of the plurality of discrete signal lines.

7. The method of claim 4 wherein absorbing downstream interference comprises coupling a power resistor to each of the discrete signal lines.

8. A method for transmitting a signal in a transmission line, comprising:

supporting a conductor on a support layer between first and second plates, each plate having a ground plane, the conductor including a combined signal line and a plurality of discrete signal lines extending from the combined signal line;

transmitting a signal along the combined signal line of the conductor;

transmitting the signal from the combined signal line along a plurality of discrete signal lines of the conductor;

substantially containing an electromagnetic field generated by the signal between the first and second plates; and coupling a power resistor to each of the plurality of discrete signal lines to absorb downstream interference on the discrete signal line.

9. The method of claim 8 further comprising tuning out parasitic capacitance at the input end of the combined signal line.

10. The method of claim 8 further comprising imparting a substantially equal phase to each of the signals transmitted on each of the plurality of discrete signal lines.

11. The method of claim 8 further comprising providing a substantially constant phase and amplitude for the transmitted signal on each of the plurality of discrete signal lines.

12. A method for transmitting a signal in a transmission line, comprising:

supporting a combined signal line by a support layer, the combined signal line having a first part supported by the first side of the support layer and a second part supported by the second side of the support layer;

supporting a plurality of discrete signal lines by the support layer, each discrete signal line having a first part supported by the first side of the support layer and a second part supported by the second side of the support layer, the plurality of discrete signal lines extending from the combined signal line;

transmitting a signal along the combined signal line;

transmitting the signal from the combined signal line along the plurality of discrete signal lines;

substantially containing the electromagnetic field generated by a signal transmitted on the combined signal line and the plurality of discrete signal lines in a propagation structure; and spacing a plurality of broadside connectors at substantially equal distances along the combined signal line in each of the plurality of discrete signal lines to maintain a substantially constant phase and amplitude for the signal transmitted on each of the lines, the plurality of broadside connectors connecting the first and second parts along the length of each of the signal lines.

13. The method of claim 12 further comprising tuning out parasitic capacitance at the input end of the combined signal line.

14. The method of claim 12 further comprising absorbing downstream power interference on each of the discrete signal lines.

* * * * *

UNITED STATES PATENT AND TRADEMARK OFFICE
CERTIFICATE OF CORRECTION

PATENT NO. : 6,608,535 B2
DATED : August 19, 2003
INVENTOR(S) : James R. Sherman et al.

Page 1 of 1

It is certified that error appears in the above-identified patent and that said Letters Patent is hereby corrected as shown below:

<u>Column 10,</u>
Line 13, after "126 to the" delete "REF" and insert -- RF --.
Line 18, delete indentation prior to "In this embodiment,".

Signed and Sealed this

Eleventh Day of May, 2004

JON W. DUDAS
*Acting Director of the United States Patent and Trademark Office*